(12) United States Patent
Liu

(10) Patent No.: US 11,862,281 B2
(45) Date of Patent: Jan. 2, 2024

(54) WORD LINE LEAD-OUT STRUCTURE AND METHOD FOR PREPARING SAME

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TCHNOLOGIES, INC., Hefei (CN)

( * ) Notice: Subject to any disclaimer, the term of this patent is extended or adjusted under 35 U.S.C. 154(b) by 268 days.

(21) Appl. No.: 17/400,456

(22) Filed: Aug. 12, 2021

(65) Prior Publication Data

US 2021/0375329 A1 Dec. 2, 2021

Related U.S. Application Data

(63) Continuation of application No. PCT/CN2021/094069, filed on May 17, 2021.

(30) Foreign Application Priority Data

May 28, 2020 (CN) ......................... 202010468064.X

(51) Int. Cl.
 *G11C 11/00* (2006.01)
 *G11C 5/06* (2006.01)
 *G11C 5/02* (2006.01)

(52) U.S. Cl.
 CPC .............. *G11C 5/063* (2013.01); *G11C 5/025* (2013.01)

(58) Field of Classification Search
 CPC ................................ G11C 5/063; G11C 5/025
 See application file for complete search history.

(56) References Cited

U.S. PATENT DOCUMENTS

| 4,707,718 A * | 11/1987 | Sakai | H01L 23/528 |
|---|---|---|---|
| | | | 257/E27.102 |
| 7,087,956 B2 | 8/2006 | Umebayashi | |
| 7,413,833 B2 | 8/2008 | Butt | |
| 10,600,791 B2 | 3/2020 | Kim et al. | |
| 2003/0011032 A1 | 1/2003 | Umebayashi | |

(Continued)

FOREIGN PATENT DOCUMENTS

| CN | 1401139 A | 3/2003 |
|---|---|---|
| CN | 107994018 A | 5/2018 |

(Continued)

OTHER PUBLICATIONS

International Search Report in the international application No. PCT/CN2021/094069, dated Jul. 29, 2021, 2 pgs.

(Continued)

*Primary Examiner* — Pho M Luu

(74) *Attorney, Agent, or Firm* — Cooper Legal Group, LLC

(57) ABSTRACT

A word line lead-out structure and a method for preparing the same are provided. A word line extending along an X-axis direction is formed on a substrate. A contact hole covering the word line along a Y-axis direction is formed, the X-axis direction being perpendicular to the Y-axis direction. A metal line covering the contact hole is formed, the contact hole being located between the word line and the metal line and being contacted with the word line and the metal line. The contact area between the contact hole and the metal line is larger than that between the contact hole and the word line.

10 Claims, 17 Drawing Sheets

(56) References Cited

U.S. PATENT DOCUMENTS

| | | | |
|---|---|---|---|
| 2004/0232471 A1* | 11/2004 | Shukuri | ............... H10B 69/00 438/257 |
| 2007/0054454 A1* | 3/2007 | Murai | ................ H01L 27/101 438/587 |
| 2008/0042171 A1 | 2/2008 | Mosler | |
| 2015/0228658 A1 | 8/2015 | Taniguchi | |
| 2016/0027796 A1 | 1/2016 | Yang | |
| 2019/0206877 A1 | 7/2019 | Kim et al. | |
| 2020/0098776 A1 | 3/2020 | Sugisaki | |

FOREIGN PATENT DOCUMENTS

| | | |
|---|---|---|
| CN | 110021599 A | 7/2019 |
| CN | 110931489 A | 3/2020 |
| JP | 2002231906 A | 8/2002 |
| KR | 20120126719 A | 11/2012 |

OTHER PUBLICATIONS

Supplementary European Search Report in European application No. 21812445.1, dated Oct. 17, 2022, 8 pgs.

* cited by examiner

WORD LINE LEAD-OUT STRUCTURE AND METHOD FOR PREPARING SAME

CROSS-REFERENCE TO RELATED APPLICATIONS

The present application is a U.S. continuation application of International Application No. PCT/CN2021/094069, filed on May 17, 2021, which claims priority to Chinese Patent Application No. 202010468064.X, filed on May 28, 2020. International Application No. PCT/CN2021/094069 and Chinese Patent Application No. 202010468064.X are incorporated herein by reference in their entireties.

TECHNICAL FIELD

The disclosure relates to the field of a semiconductor, and specifically to a word line lead-out structure and a method for preparing of a word line lead-out structure.

BACKGROUND

A semiconductor memory uses a transistor array to control the charging and discharging of a storage capacitor to realize data access. A gate of the transistor is electrically connected with a word line. After the word line is formed in a substrate, a word line lead-out structure needs to be formed above the word line to reach an electric connection between the word line and an external control circuit.

However, with the continuous improvement of the integration level of a semiconductor device, the size of a word line and the space between word lines are increasingly reduced; correspondingly, the area of the word line lead-out structure is increasingly reduced. As a result, the contact resistance between the word line lead-out structure and corresponding words line is increased, so that a current flowing through the word line is reduced, thereby reducing and the induction margin of the semiconductor device and the charging and discharging speed of the storage capacitor.

SUMMARY

A first aspect of the present application provides a word line lead-out structure including a word line, a contact hole, and a metal line.

The word line extends along an X-axis direction.

The contact hole covers the word line along a Y-axis direction, and the X-axis direction is perpendicular to the Y-axis direction.

The metal line covers the contact hole, and the contact hole is located between the word line and the metal line and is contacted with the word line and the metal line.

The contact area between the contact hole and the metal line is larger than that between the contact hole and the word line.

Another aspect of the present application provides a method for preparing a word line lead-out structure. The method includes the following operations.

A first groove is provided in a substrate.

A word line extending along an X-axis direction is formed in the first groove. The top surface of the word line is lower than that of the substrate.

A contact hole layer is formed on the word line and the substrate.

A metal layer is formed on the contact hole layer.

The metal layer and the contact hole layer are etched to form the above word line lead-out structure.

The details of one or more embodiments of the disclosure are set forth in the accompanying drawings and description below. Other features, objects, and advantages of the disclosure will be apparent from the specification, drawings, and claims.

BRIEF DESCRIPTION OF THE DRAWINGS

For a clear illustration of technical solutions of embodiments of the present application, reference may be made to one or more of figures, but the additional details or examples used to describe the drawings should not be construed as limiting the scope of any one of inventions and innovations, currently described embodiments, or preferred modes of the present application.

DETAILED DESCRIPTION

Figure 1:
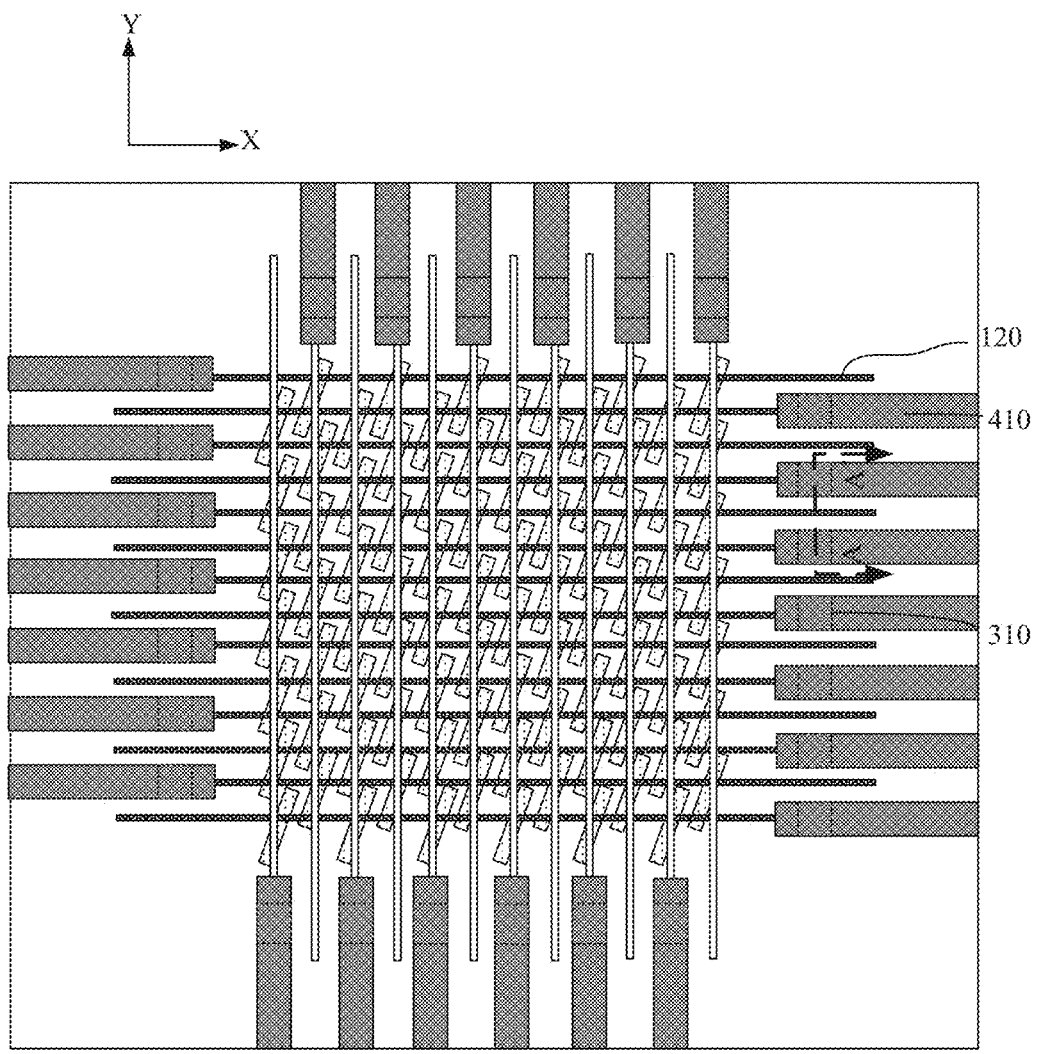
FIG. 1 is a top view of the distribution of a word line lead-out structure of one embodiment.

To facilitate understanding of the present application, the present application will be described below in detail with reference to the accompanying drawings. Embodiments of the present application are illustrated in the accompanying drawings. However, the present application may be embodied in many different forms and should not be construed as limited to the embodiments set forth herein. Rather, these embodiments are provided so that the present application will be thorough and complete.

Unless defined otherwise, all technical and scientific terms used herein have the same meaning as commonly understood by those of ordinary skill in the art to which the present application belongs. The terms used herein in the specification of the present application are for the purpose of describing specific embodiments only and are not intended to limit the present application.

It is to be understood that when an element or a layer is referred to as being "on", it can be directly on the other element or layer or an intervening element or layer may be present. It is to be understood that although the terms first, second, third, and the like may be used to describe various elements, components, regions, layers, doping types and/or parts, these elements, components, regions, layers, doping types and/or parts should not be limited by these terms. These terms are only used to distinguish one element, component, region, layer, doping type, or part from another element, component, region, layer, doping type, or part. Therefore, a first element, component, region, layer, doping type, or part discussed below may be represented as a second element, component, region, layer or part without departing from the teaching of the disclosure.

Spatial relation terms such as "under", "underneath", "lower", "below", "above", "upper", and the like, may be used herein to describe a relation between one element or feature and another element or feature as illustrated in the figures. It is to be understood that in addition to the orientation shown in the figures, the spatial relation terms further include different orientations of a device in use and operation. For example, if the device in the figures is turned over, the element or feature described as "underneath the other element" or "below it" or "under it", the element or feature will be oriented "over" the other element or feature. Therefore, the exemplary terms "underneath" and "below" may include both above and below. In addition, the device may also include additional orientations (for example, rotated 90 degrees or other orientations), and the spatial descriptors used herein are interpreted accordingly.

As used herein, the singular forms "a", "an", and "the/the" can also include the plural forms, unless the context clearly indicates otherwise. It is also to be understood that the terms "comprise/include" or "have" or the like specify the presence of a stated feature, integer, step, operation, component, part, or a combination thereof, but do not preclude the presence or addition of one or more other features, integers, steps, operations, components, parts, or combinations thereof. Meanwhile, in the specification, the term "and/or" includes any and all combinations of the associated listed items.

Figure 2:
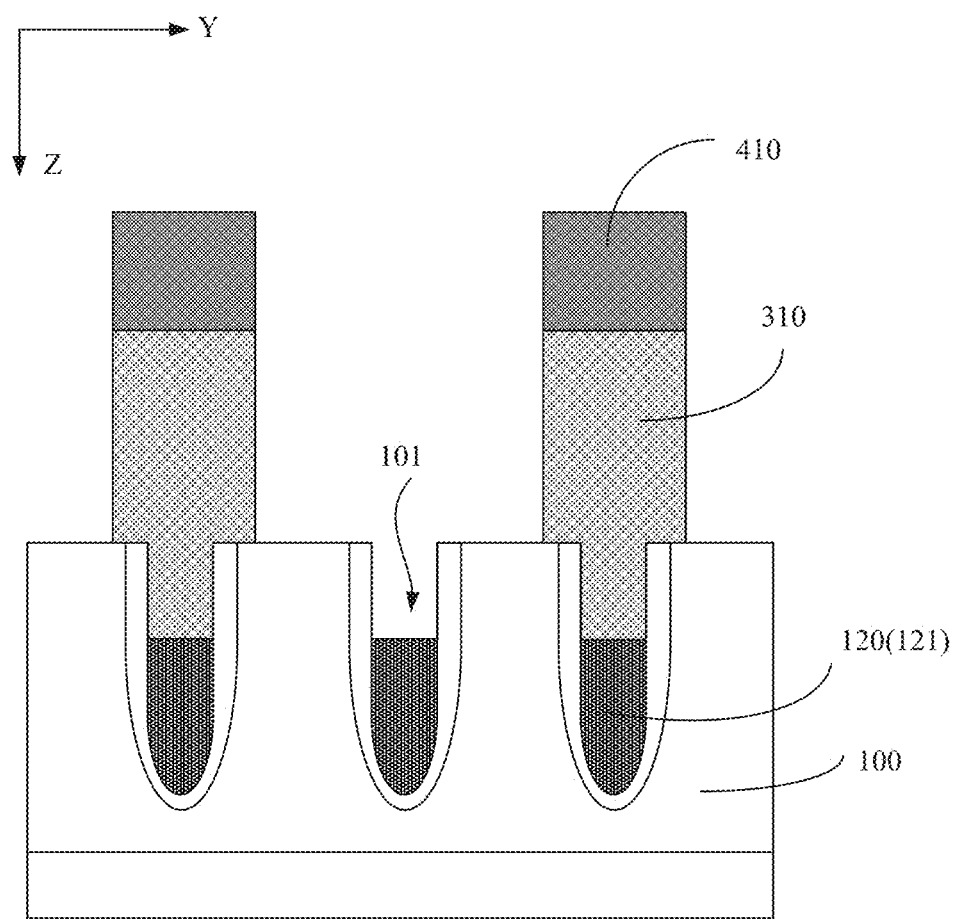
FIG. 2 is a side cross-sectional view of one embodiment corresponding to a section line AA' in FIG. 1.

FIG. 1 is a top view of a word line lead-out structure in one embodiment of the present application. FIG. 2 is a side cross-sectional view corresponding to a section line AA' in FIG. 1.

As shown in combination with FIG. 1 and FIG. 2, the word line lead-out structure includes a word line 120, a contact hole 310, and a metal line 410.

The word line 120 extends along an X-axis direction.

The contact hole 310 is located above the word line 120 and covers the word line 120 along a Y-axis direction, and the Y-axis direction is perpendicular to the X-axis direction. The contact hole 310 covering the word line 120 along the Y-axis direction means that a width of the contact hole 310 along the Y-axis direction is greater than or equal to that of the word line 120 along the Y-axis direction, and the contact hole 310 covers a segment of the word line 120 along the X-axis direction.

The metal line 410 is located on the contact hole 310 and covers the contact hole 310, that is, the contact hole 310 is located between the word line 120 and the metal line 410, a bottom surface of the contact hole 310 is in contact with the word line 120, and a top surface of the contact hole 310 is in contact with the metal line 410. The contact area between the contact hole 310 and the metal line 410 is larger than that between the contact hole 310 and the word line 120, and the width of the contact surface between the contact hole 310 and the metal line 410 along the Y-axis direction is greater than the width of the contact surface between the contact hole 310 and the word line 120 along the Y-axis direction.

According to the above word line lead-out structure, the word line 120 is formed in a semiconductor device. By forming the contact hole 310 and the metal line 410 above the word line 120, an external electric signal is transmitted to the word line 120 through the metal line 410 and the contact hole 310, and the semiconductor device is controlled through the word line 120. In the present application, the contact hole 310 covers the word line 120 along the Y-axis direction, and the metal line 410 covers the contact hole 310. The contact area between the contact hole 310 and the metal line 410 is larger than that between the contact hole 310 and the word line 120. By adjusting the contact area between the contact hole 310 and the word line 120 and the contact area between the contact hole 310 and the metal line 410, the contact area between the contact hole 310 and the word line 120 is relatively small, so that the influence of the contact hole 310 on the integration level of the device is reduced. The contact area between the contact hole 310 and the metal line 410 is relatively large, so that the contact resistance of the whole word line lead-out structure is reduced, thereby improving the induction margin of the semiconductor memory and the charging and discharging speed of a storage capacitor.

In one embodiment, as shown in FIG. 2, a cross-section of the contact hole 310 is a T-shaped structure, that is, a section of the contact hole 310 along a Z-axis direction shown in FIG. 2 is the T-shaped structure. The X-axis, the Y-axis, and the Z-axis are perpendicular to each other. In this embodiment, the contact hole 310 is the T-shaped structure, and the width of the top surface of the contact hole 310 along the Y-axis direction is greater than the width of the bottom surface the contact hole 310 along the Y-axis direction, so that the contact area between the contact hole 310 and the metal line 410 is larger than that between the contact hole 310 and the word line 120.

More specifically, a substrate 100 is provided with a first groove 101 extending along the X-axis direction, the word line 120 is filled in the first groove 101, and the thickness of the word line 120 is smaller than the depth of the first groove 101, that is, the top surface of the word line 120 is lower than the top surface of the substrate 100. A part of the contact hole 310 is filled in the first groove 101, the contact hole 310 located outside the first groove 101 extends to the substrate 100 at both sides of the word line 120 along the Y-axis direction. At this time, the contact hole 310 located in the first groove 101 together with the contact hole 310 located outside the first groove 101 together form the contact hole 310 with the T-shaped structure. Further, the width of the metal line 410 above the contact hole 310 along the Y-axis direction is equal to that of the contact hole 310 along the Y-axis direction, and side surfaces of the contact hole 310 and the metal line 410 extending along the X-axis direction are aligned with each other. In one embodiment, the word line 120 includes a metal structure 121 located at the bottom of the first groove 101, and a polysilicon structure located at the top of the metal structure 121. The polysilicon structure of the word line in a region covered by the contact hole 310 is removed, that is, the word line in the region covered by the contact hole 310 does not include the polysilicon structure, and the contact hole 310 is in direct contact with the metal structure 121, thereby reducing parasitic resistance between the word lines.

In one embodiment, as shown in combination with FIG. 1 and FIG. 2, the word line lead-out structure includes 2*N word lines 120, each of the word line 120 is distributed in parallel along the Y-axis direction, 2*N contact holes 310 are respectively formed on the 2*N word lines 120, 2*N metal lines 410 are respectively formed on the 2*N contact holes 310, and each of the metal line 410 extends along the X-axis direction. N is a positive integer, and the 2*N word lines 120, the 2*N contact holes 310 and the 2*N metal lines 410 are in one-to-one correspondence. In this embodiment, the 2*N word lines 120 which are distributed in parallel along the Y-axis direction are formed on the substrate 100. The contact hole 310 and the metal line 410 corresponding to each word line 120 are formed above each word line 120, that is, each word line 120 corresponds to one independent word line lead-out structure, so that each word line 120 is independently controlled. Further, the 2*N word lines 120 are aligned in the Y-axis direction, that is, the 2*N word lines 120 are the same in length along the X-axis direction, and an endpoint of each of the word lines 120 is aligned along the Y-axis direction.

More specifically, as shown in FIG. 1, N metal lines 410 and N contact holes 310 are located at one side of the word line 120 along the X-axis direction, and the other N metal lines 410 and the other N contact holes 310 are located at the other side of the word line 120 along the X-axis direction. The metal lines 410 at the same side are distributed in parallel along the Y-axis direction. In this embodiment, 2*N lead-out structures formed by the 2*N contact holes 310 and the 2*N metal lines 410 are divided into two groups of the lead-out structures. A first group of the lead-out structures include N contact holes 310, and N metal lines 410 in contact with the N contact holes 310. A second group of lead-out structures include further N contact holes 310, and further N metal lines 410 in contact with the further N contact holes 310. The first group of lead-out structures is close to one endpoint of the word line 120, and the second group of lead-out structures is close to the other endpoint of the word line 120. By dispersedly arranging the metal line 410 and the contact hole 310 at both sides of the word line 120, the width of the metal line 410 or the contact hole 310 can be appropriately increased, thereby reducing the contact resistance of the word line lead-out structure.

Further, the contact hole 310 and the metal line 410 at one side of the word line 120 cover the odd-numbered word lines 120, and the contact hole 310 and the metal line 410 at the other side of the word line 120 cover the even-numbered word lines 120. In this embodiment, the 2*N word lines 120 are sequentially arranged along the Y-axis direction, the first group of the lead-out structures are arranged on the odd-numbered word lines 120, and the second group of the lead-out structures are arranged on the even-numbered word lines 120, so that the space between adjacent contact holes 310 is increased, further, the width of the contact hole 310 and the metal line 410 is increased, the contact area is increased, and the contact resistance is reduced.

In one embodiment, the conductivity of the contact hole 310 is different from the conductivity of the metal line 410, that is, materials of the metal line 410 and the contact hole 310 are different. Specifically, the material of the contact hole 310 may be metal or metal alloy including one or more of copper, aluminum, nickel, tungsten, silver, gold, and the like. The metal line 410 may be one of a copper line, an aluminum line, a nickel line, a tungsten line, a silver line, a gold line, and the like.

Figure 3:
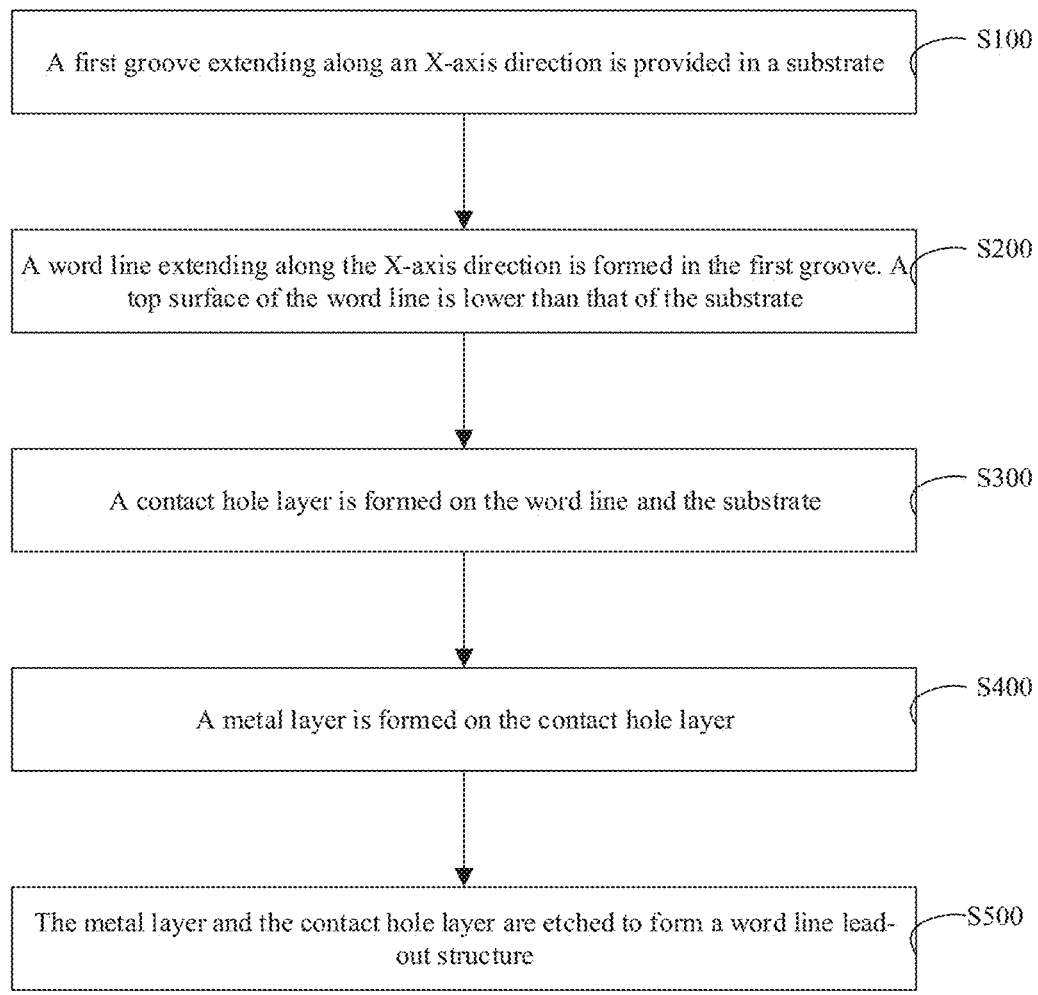
FIG. 3 is a flowchart illustrates steps of a method for preparing a word line lead-out structure of one embodiment.

FIG. 3 shows a method for preparing a word line lead-out structure in one embodiment of the present application.

In one embodiment, the method for preparing a word line lead-out structure includes the following operations.

At S100: a first groove extending along an X-axis direction is formed in a substrate.

At S200, a word line extending along the X-axis direction is formed in the first groove. A top surface of the word line is lower than that of the substrate.

Figure 4A:
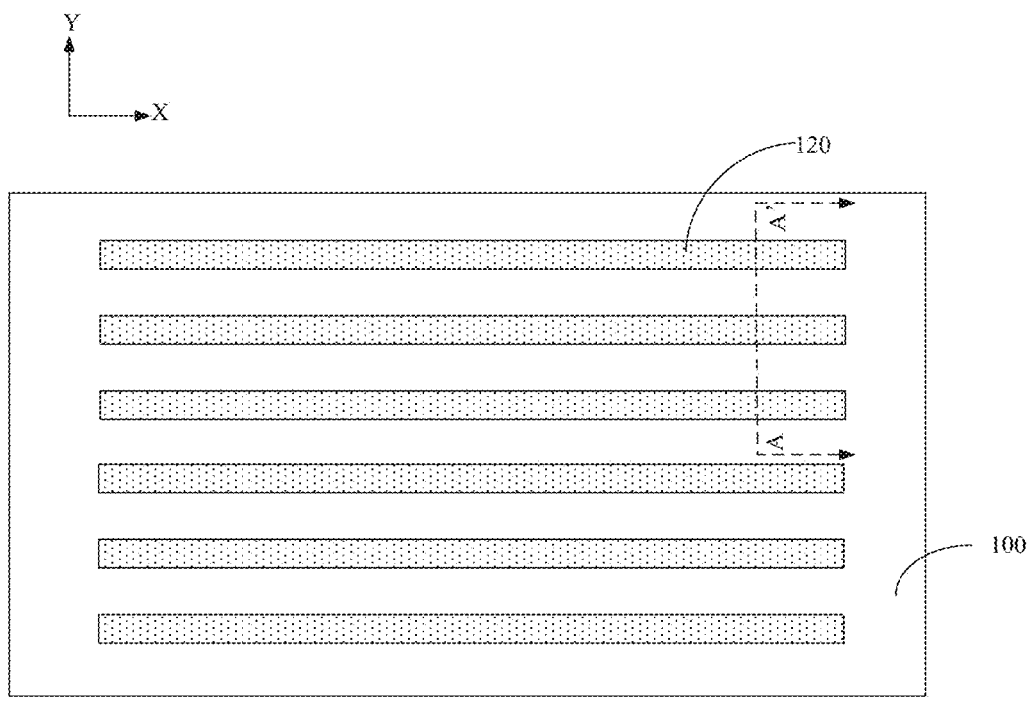
FIG. 4A is a top view of one embodiment in which a word line is formed.
Figure 4B:
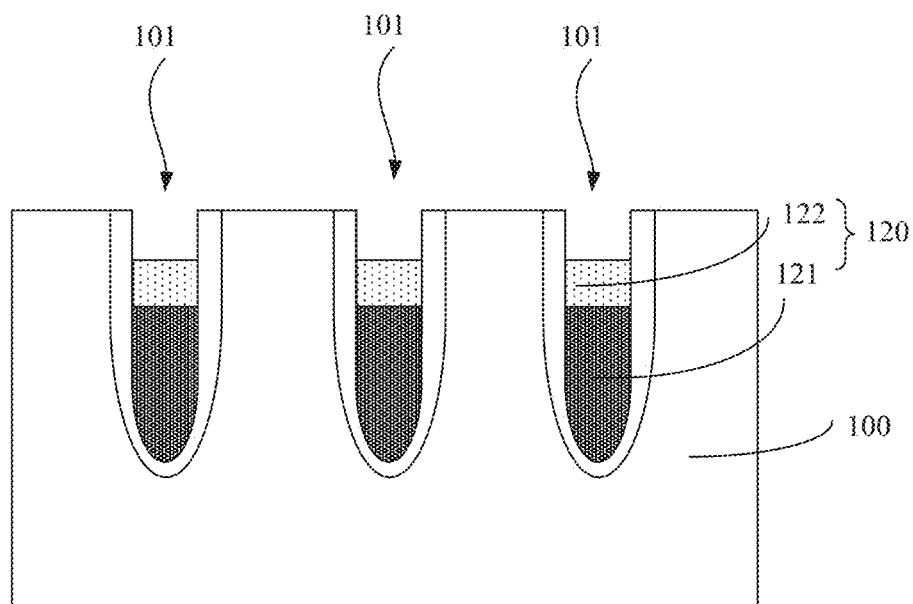
FIG. 4B is a side cross-sectional view of one embodiment corresponding to a section line AA' in FIG. 4A.

In combination with FIG. 4A and FIG. 4B, FIG. 4A is a top view in which the word line 120 is formed, and FIG. 4B is a side cross-sectional view corresponding to a section line AA' in FIG. 4A.

Specifically, the first groove 101 extending along the X-axis direction is provided in the substrate 100, the word line 120 extending along the X-axis direction is formed in the first groove 101. The top surface of the word line 120 is lower than the top surface of the substrate 100, that is, the thickness of the word line 120 is smaller than the depth of the first groove 101. Further, the word line 120 includes a metal structure 121 at the bottom of the first groove 101 and a polysilicon structure 122 located on the metal structure 121.

In a specific embodiment, as shown in FIG. 4A, the substrate 100 is provided with 2*N first grooves 101 respectively extending along the X-axis direction, and each of the grooves is distributed in parallel along the Y-axis direction. 2*N word lines 120 extending along the X-axis direction are formed in the 2*N first grooves 101, and each of the word lines 120 is distributed in parallel along the Y-axis direction. Further, the above word lines 120 are aligned in the Y-axis direction, that is, the 2*N word lines 120 are the same in length along the X-axis direction, and an endpoint of each of the word lines 120 is aligned along the Y-axis direction.

In a specific embodiment, a procedure of forming the word line 120 includes the following operations.

At S210: a word line material layer is deposited in the first groove and on the substrate outside the first groove.

Specifically, one word line material layer is deposited through a deposition process. The word line material layer has certain thickness and covers the first groove 101 and the substrate 100.

At S220: the top surface of the word line material layer is flattened; the word line material layer on the substrate is removed so that the word line material layer in the first groove is reserved.

After the word line material layer is deposited, the word line material layer has an uneven upper surface. Next, the upper surface of the word line material layer is ground through a chemical mechanical grinding process, so that the upper surface of the word line material layer is flattened. The word line material layer is etched to expose the substrate 100, so that the word line material layer in the first groove 101 is reserved.

At S230: the word line material layer in the first groove is etched back, the word line material layer at the top of the first groove is removed, so that the word line material layer at the bottom of the first groove is reserved, thereby forming the word line.

Specifically, the word line material layer in the first groove 101 is etched through an etching process to reduce the thickness of the word line material layer, so that the thickness of the word line material layer is smaller than the depth of the first groove 101. After etching is stopped, the reserved word line material layer forms the word line 120. The etch-back depth of the word line material layer can be flexibly selected according to specific requirements.

After the word line 120 is formed, execution is continued.

At S300: a contact hole layer is formed on the word line and on the substrate outside the first groove.

In one embodiment, the contact hole layer 300 is formed directly on the word line 120 and on the substrate 100 outside the first groove 101.

In another embodiment, S300 includes the following sub-operations.

At S311: a dielectric layer is formed on the substrate and the first groove.

The dielectric layer 200 is deposited on the substrate 100 and the first groove 101 through the deposition process, and the top surface of the dielectric layer 200 is ground to flatten the top surface of the dielectric layer 200.

At S312: the dielectric layer is etched to form a second groove extending along the Y-axis direction. The second groove penetrates through the dielectric layer and exposes the word line and the substrate.

Figure 5A:
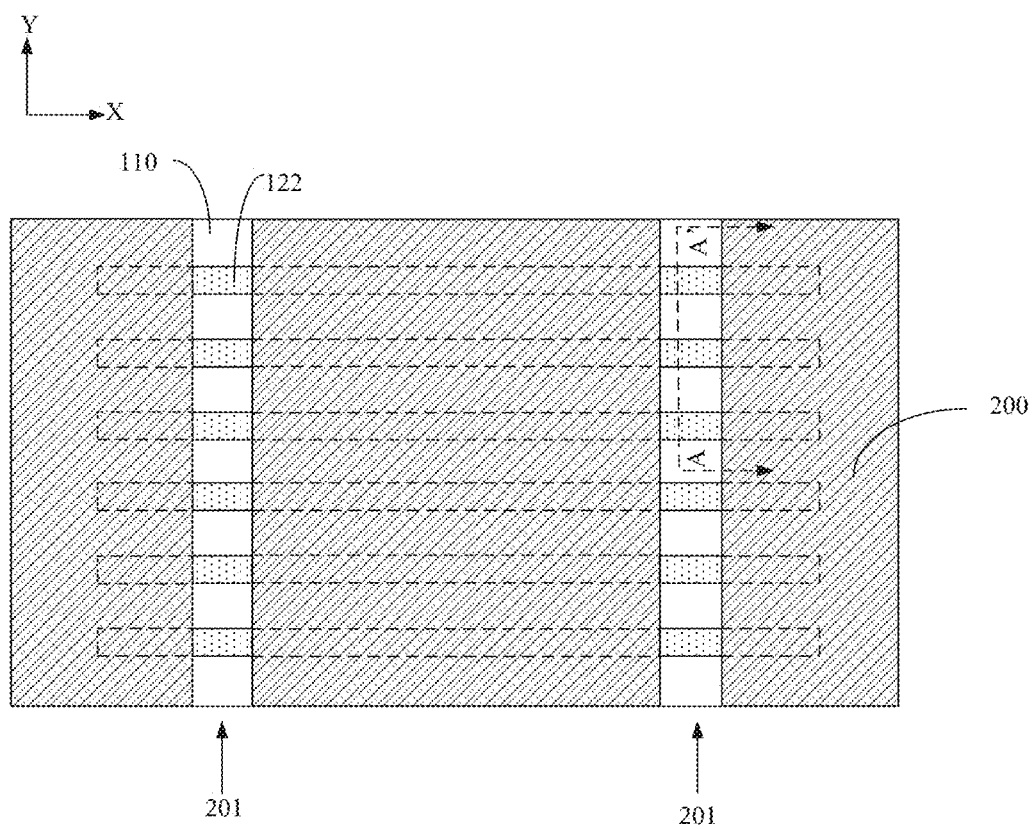
FIG. 5A is a top view of one embodiment in which a second groove is provided in a dielectric layer.
Figure 5B:
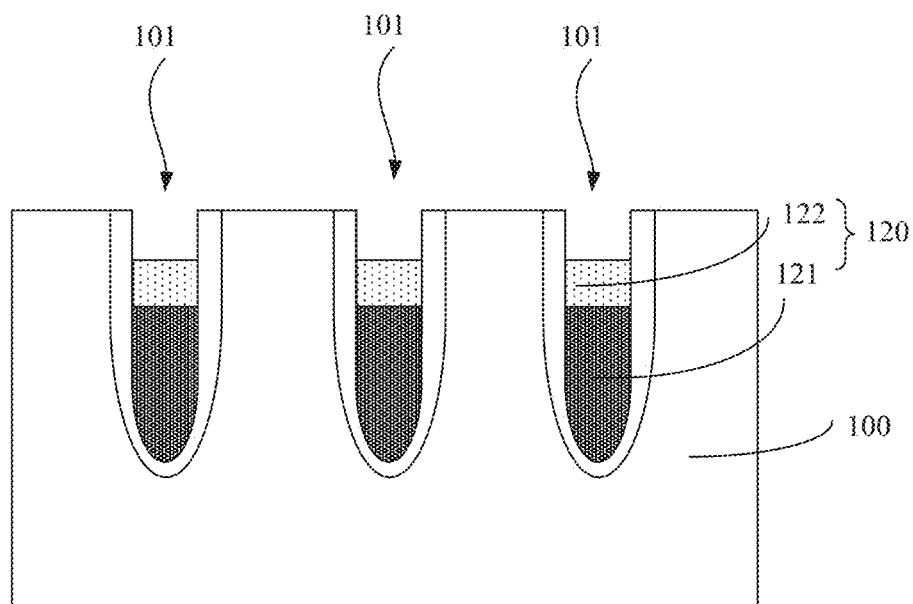
FIG. 5B is a side cross-sectional view of one embodiment corresponding to a section line AA' in FIG. 5A.

As shown in FIG. 5A and FIG. 5B, FIG. 5A is a top view in which a second groove 201 is formed in the dielectric layer 200, and FIG. 5B corresponds to a side cross-sectional view of a section line AA' in FIG. 5A. The dielectric layer 200 is etched. The second groove 201 extending along the Y-axis direction is formed on the dielectric layer 200. The second groove 201 penetrates through the dielectric layer 200 along a Z-axis direction and exposes the word line 120 (specifically, the polysilicon structure 122 in the word line 120) and the substrate 100 at the bottom of the second groove 201. It is to be noted that in this embodiment, the etching selectivity ratio of the dielectric layer 200 and the substrate 100 is different, so that the substrate 100 is not substantially etched during the etching of the dielectric layer 200 to form the second groove 201.

In one embodiment, as shown in FIG. 5A, two second grooves 201 respectively extending along the Y-axis direction are formed in the dielectric layer 200. One of the second grooves 201 is located at one side of the word line 120 extending along the X-axis direction, and the other of the second grooves 201 is located at the other side of the word line 120 extending along the X-axis direction, that is, the two second grooves 201 are distributed in parallel along the X-axis direction. Further, the two second grooves 201 are respectively close to end points on two sides of the word line 120 along the X-axis direction.

Figure 6A:
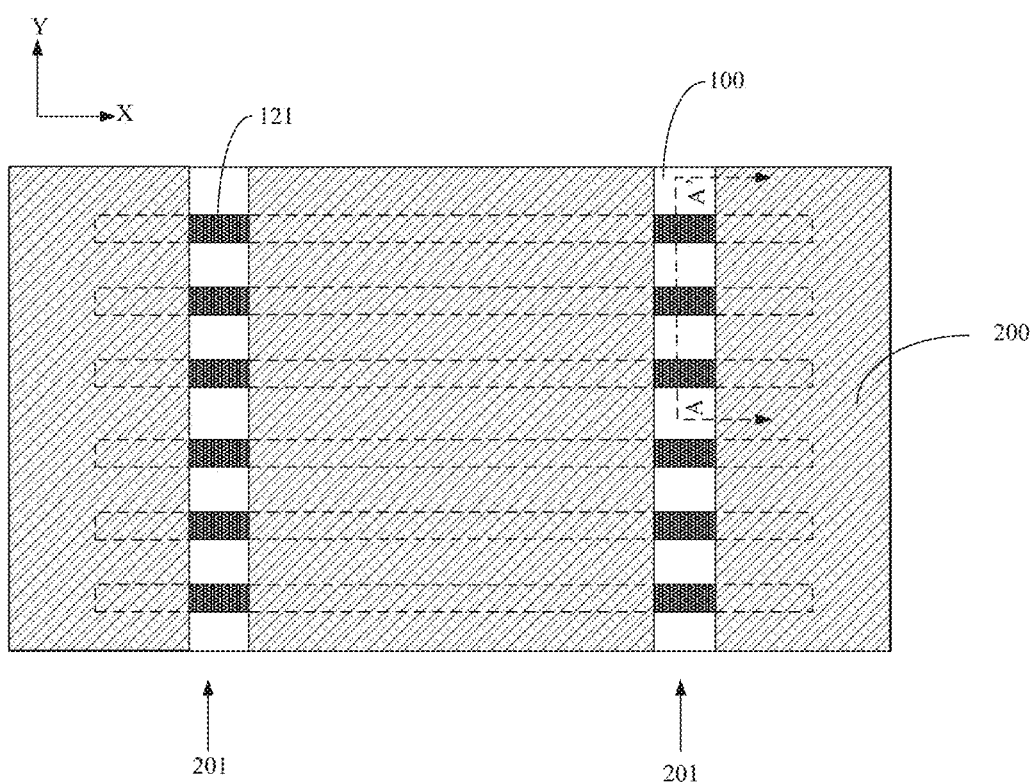
FIG. 6A is a top view of one embodiment in which a polysilicon structure is removed.
Figure 6B:
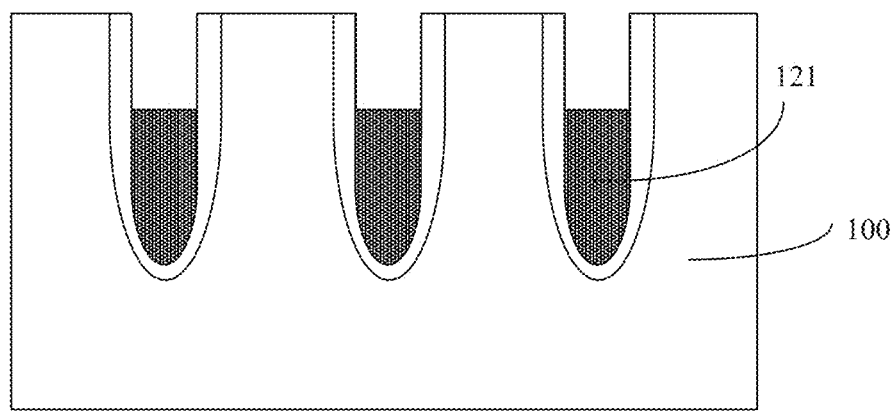
FIG. 6B is a side cross-sectional view of one embodiment corresponding to a section line AA' in FIG. 6A.

In a specific embodiment, as shown in FIG. 6A and FIG. 6B, FIG. 6A is a top view in which an exposed polysilicon structure is removed, and FIG. 6B corresponds to a side cross-sectional view of a section line AA' in FIG. 6A. When the polysilicon structure 122 of the word line is exposed due to the second groove 201, execution is continued. The exposed polysilicon structure 122 is removed, so that the metal structure 121 is reserved.

At S313: the contact hole layer is formed in the first groove and the second groove.

Figure 7A:
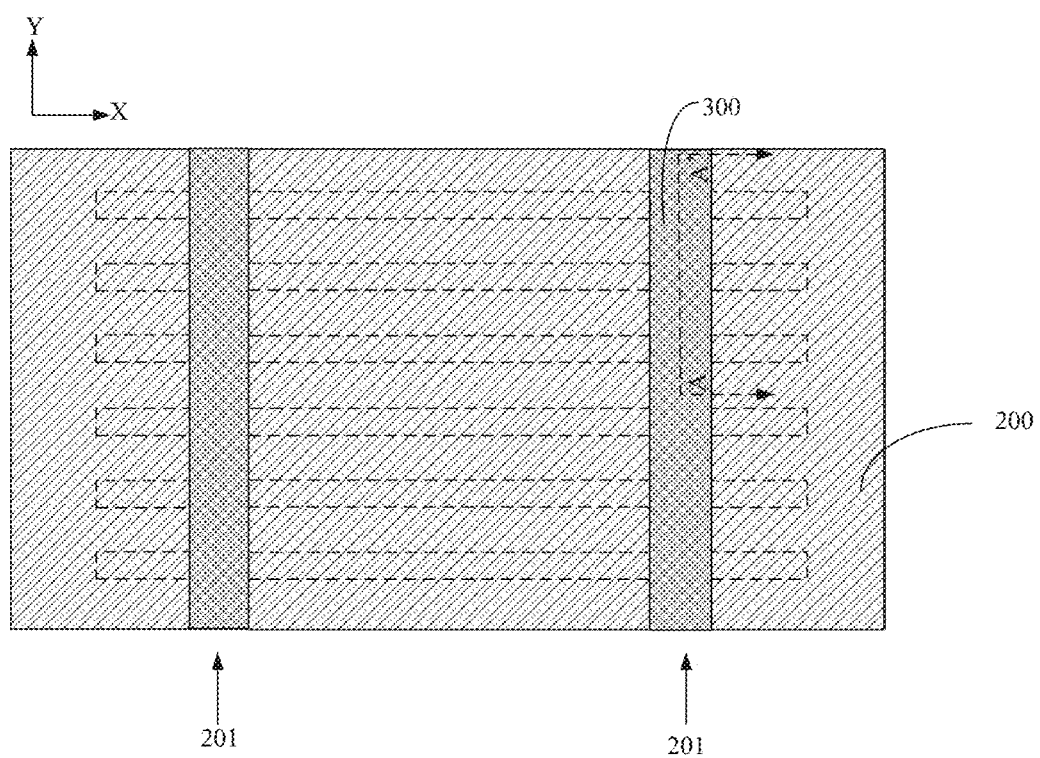
FIG. 7A is a top view of one embodiment in which a first groove and a second groove are filled with a contact hole layer.
Figure 7B:
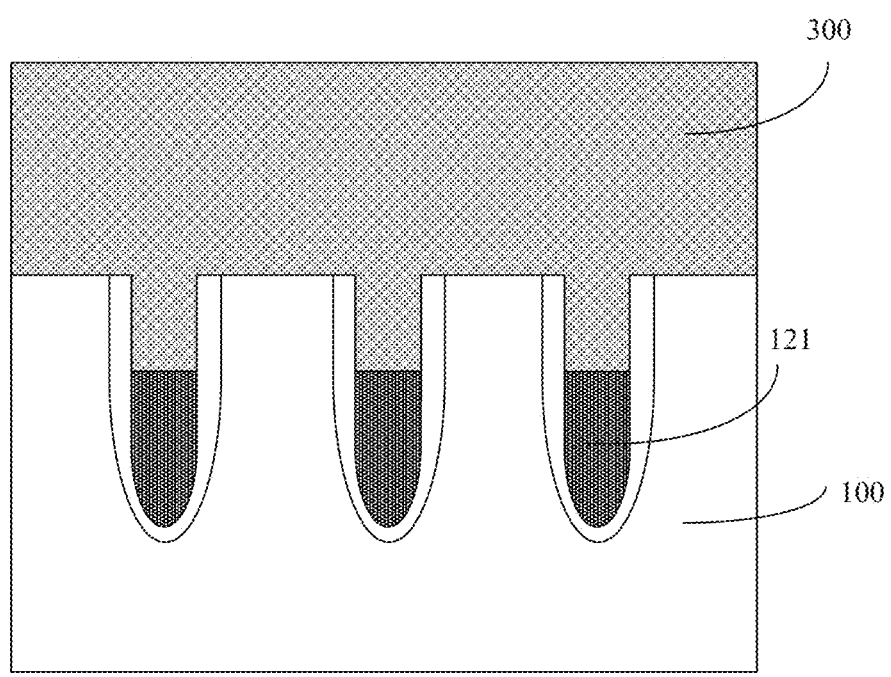
FIG. 7B is a side cross-sectional view of one embodiment corresponding to a section line AA' in FIG. 7A.

As shown in FIG. 7A and FIG. 7B, FIG. 7A is a top view in which the first groove 101 and the second groove 201 are filled with the contact hole layer 300, and FIG. 7B corresponds to a side cross-sectional view of a section line AA' in FIG. 7A. A thicker layer of contact hole material is deposited through a deposition process, the contact hole material fills the exposed first groove 101 and second groove 201 and is higher than the dielectric layer 200, then the contact hole material is flattened through a grinding process, the contact hole material above the dielectric layer 200 is removed, so that only the contact hole material in the first groove 101 and the second groove 201 is reserved, thereby forming the required contact hole layer 300.

In the above embodiment, the contact hole layer 300 is formed through S311 to S313. In other embodiments, the required contact hole layer 300 can also be formed through the following sub-operations S321 to S323.

At S321: the contact hole material is deposited on the substrate 100 and the first groove 101.

At S322: the contact hole material is etched, so that the contact hole material at two sides is removed to form the contact hole layer 300 extending along the Y-axis direction.

At S323: a dielectric material is deposited and flattened. The dielectric material layer above the contact hole layer 300 is removed, the contact hole layer 300 is exposed, and the dielectric material at two sides of the contact hole layer 300 is reserved to form the dielectric layer 200.

Through the above steps, after the contact hole layer 300 is formed, execution is continued.

At S400: a metal layer is formed on the contact hole layer.

Figure 8A:
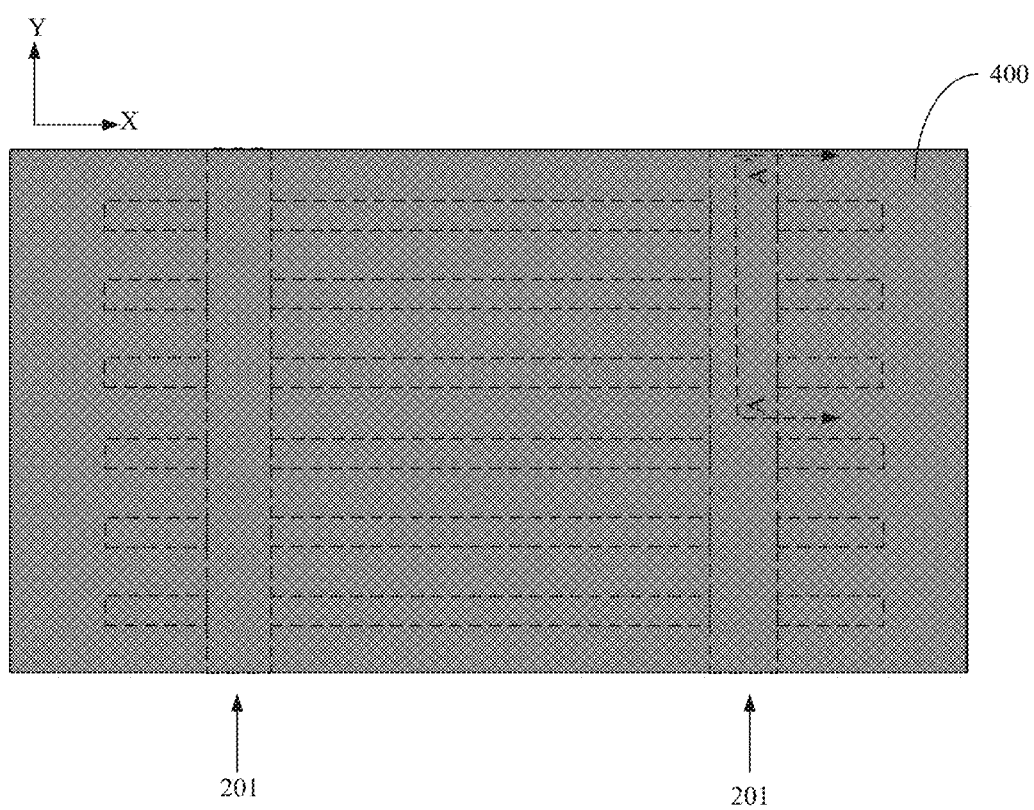
FIG. 8A is a top view of one embodiment in which a metal layer is formed.
Figure 8B:
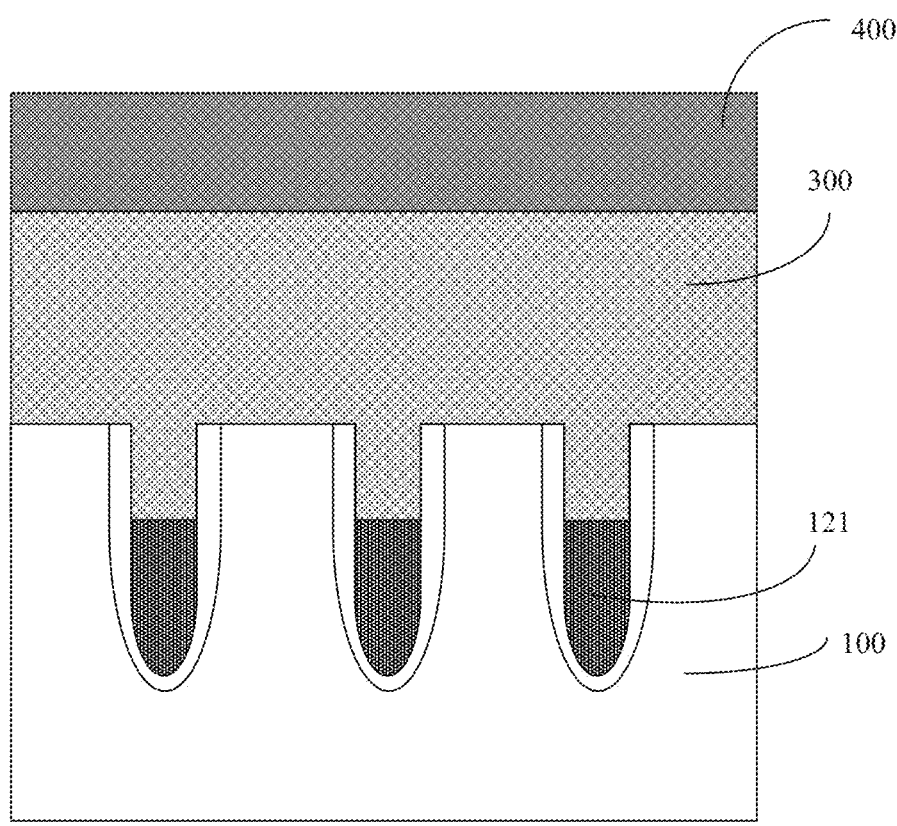
FIG. 8B is a side cross-sectional view of one embodiment corresponding to a section line AA' in FIG. 8A.

As shown in FIG. 8A and FIG. 8B, FIG. 8A is a top view in which a metal layer 400 is formed, and FIG. 8B is a side cross-sectional view corresponding to a section line AA' in FIG. 8A. The metal layer 400 is formed on the contact hole layer 300 through the deposition process. In one embodiment, the contact hole layer 300 is formed in the second groove 201, and the metal layer 400 is formed on the contact hole layer 300 and the dielectric layer 200.

At S500: the metal layer and the contact hole layer are etched to form the word line lead-out structure.

After the metal layer 400 is formed on the contact hole layer 300, the metal layer 400 and the contact hole layer 300 are etched. The metal layer 400 is etched to form the metal line 410, and the contact hole layer 300 is etched to form the contact hole 310, so that the word line lead-out structure is formed. A location relation of the word line 120, the contact hole 310 and the metal line 410 in the word line lead-out structure has been described above and will not be described in detail herein.

In one embodiment, the operation that the metal layer 400 and the contact hole layer 300 are etched specifically includes that: a mask is formed on the metal layer 400, the exposed metal layer 400 is etched downward under the protection of the mask to form the metal line 410, and the exposed contact hole layer 300 is continuously etched downward under the protection of the metal line 410 to form the contact hole 310. That is, the above etching of the contact hole layer 300 belongs to self-aligned etching, and boundaries of the contact hole 310 and the metal line 410 formed after the self-aligned etching are aligned, so that an influence on the electric performance of a device resulted from an offset between the contact hole layer 310 and the metal line 410 is prevented.

In a specific embodiment, 2*N word lines 120 are formed on the substrate 100, and the contact hole layer 300 is formed in the second groove 201 and extends along the Y-axis direction. At this time, S500 includes the following operations.

At S510: 2*N masks are formed on the metal layer; each of the masks spans the second groove 201 along the X-axis direction and covers a word line along the Y-axis direction.

Figure 9A:
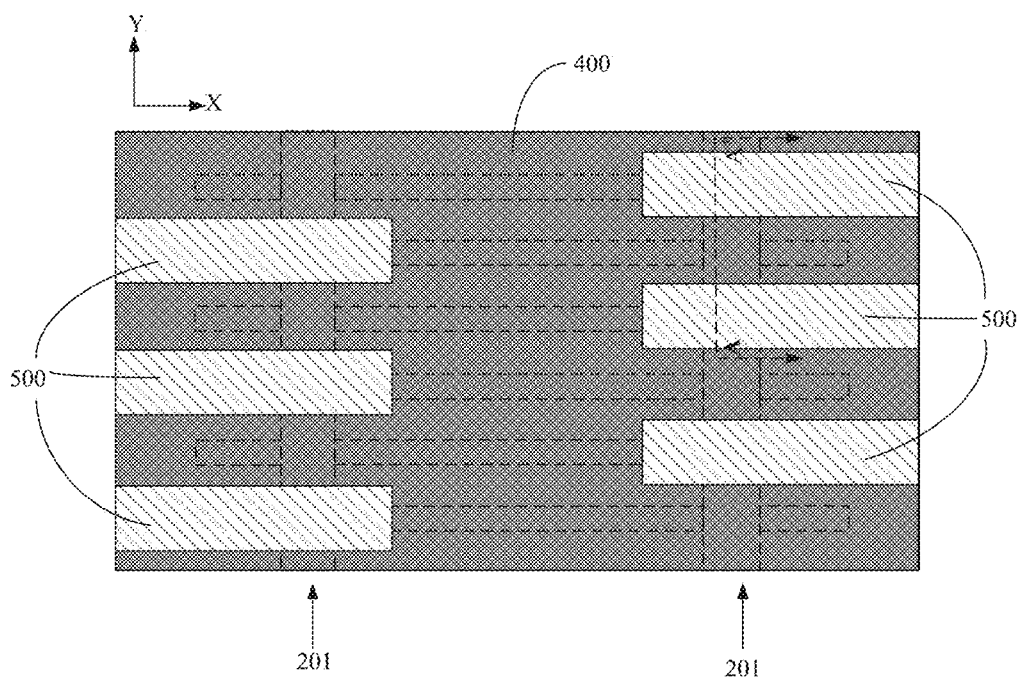
FIG. 9A is a top view of one embodiment in which 2*N masks are formed.
Figure 9B:
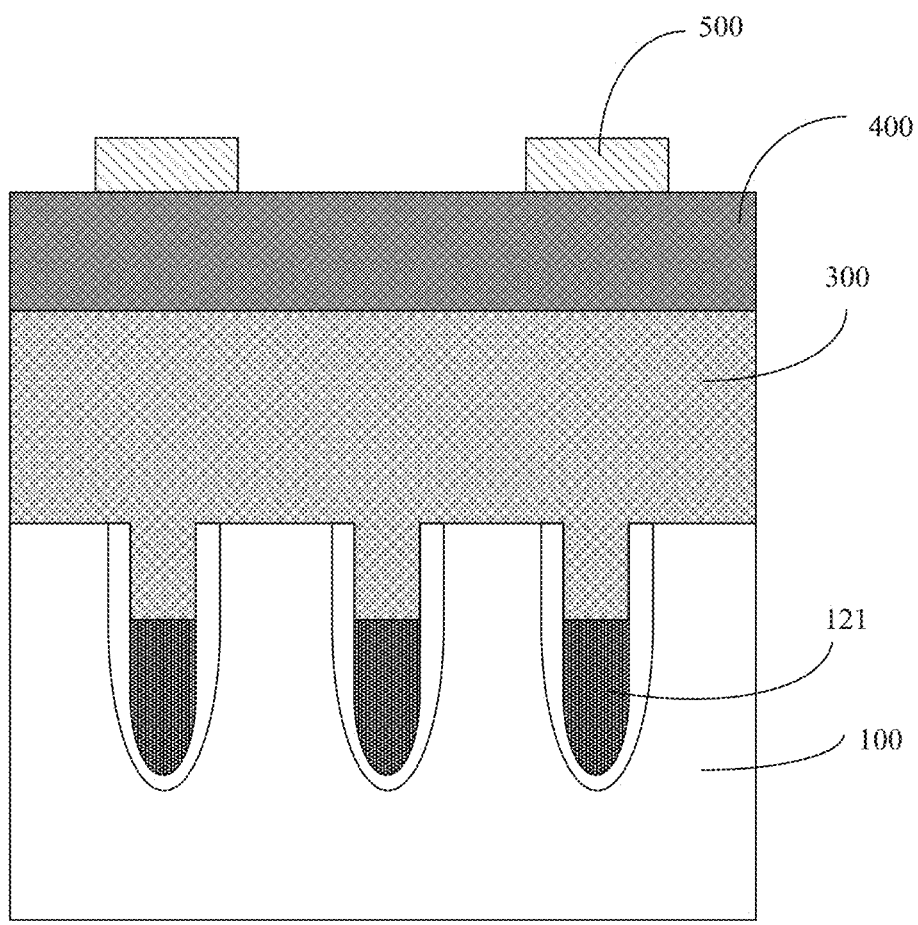
FIG. 9B is a side cross-sectional view of one embodiment corresponding to a section line AA' in FIG. 9A.

As shown in FIG. 9A and FIG. 9B, FIG. 9A is a top view in which 2*N masks 500 are formed, and FIG. 9B corresponds to a side cross-sectional view of a section line AA' in FIG. 9A. The 2*N masks 500 are formed on the metal layer 400, each of the masks 500 spans the second groove 201 along the X-axis direction and one mask 500 covers one word line 120 along the Y-axis direction, that is, the 2*N masks 500 and the 2*N word lines 120 are in one-to-one correspondence. Furthermore, two second grooves 201 are formed in the dielectric layer 200, when two contact hole layers 300 extending along the Y-axis direction are respectively correspondingly formed in the two second grooves 201, among the 2*N masks 500, N masks 500 are located at one side of the metal layer 400 along the X-axis direction and span the second grooves 201 located at the same side along the X-axis direction, and respectively cover the odd-numbered word lines 120. The other N masks 500 are located at the other side of the metal layer 400 along the X-axis direction and span the other second grooves 201 located at the same side along the X-axis direction, and respectively cover the even-numbered word lines 120. Further, the masks 500 at the same side are distributed in parallel along the Y-axis direction.

At S520: the metal layer and the contact hole layer are sequentially etched, the metal layer below the mask is reserved to form 2*N metal lines, and the contact hole layer below the metal line is reserved to form 2*N contact holes. N is a positive integer, and the 2*N word lines, the 2*N contact holes and the 2*N metal lines are in one-to-one correspondence.

Figure 10A:
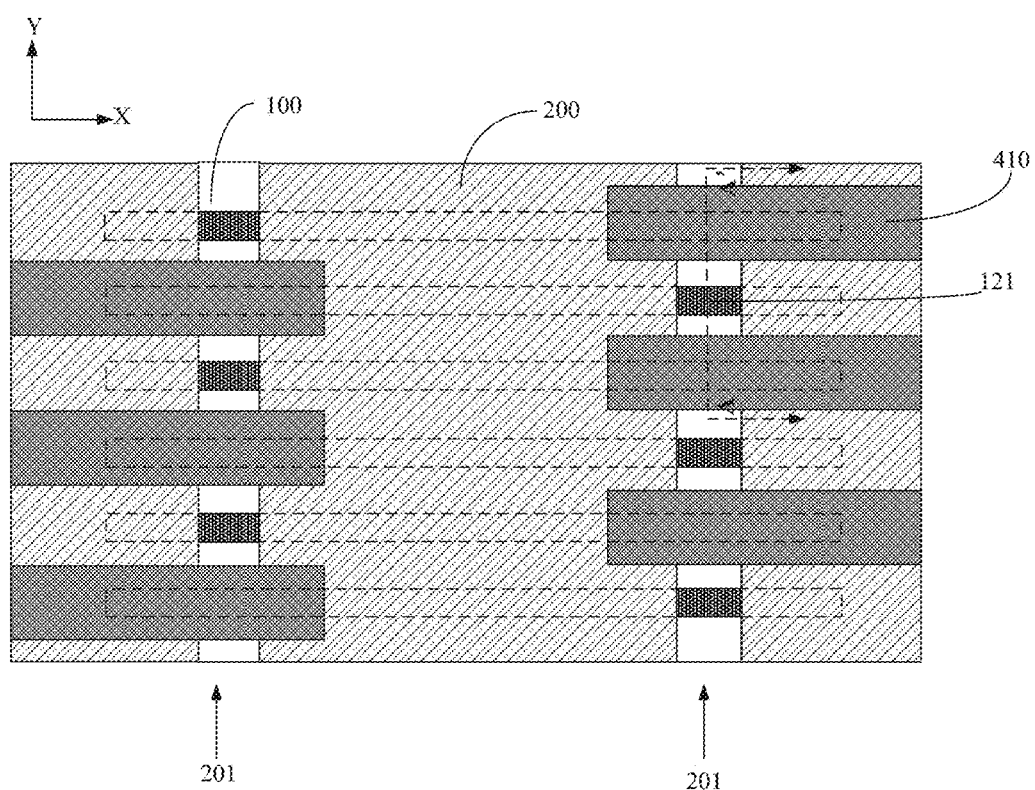
FIG. 10A is a top view of one embodiment in which 2*N metal lines are formed.
Figure 10B:
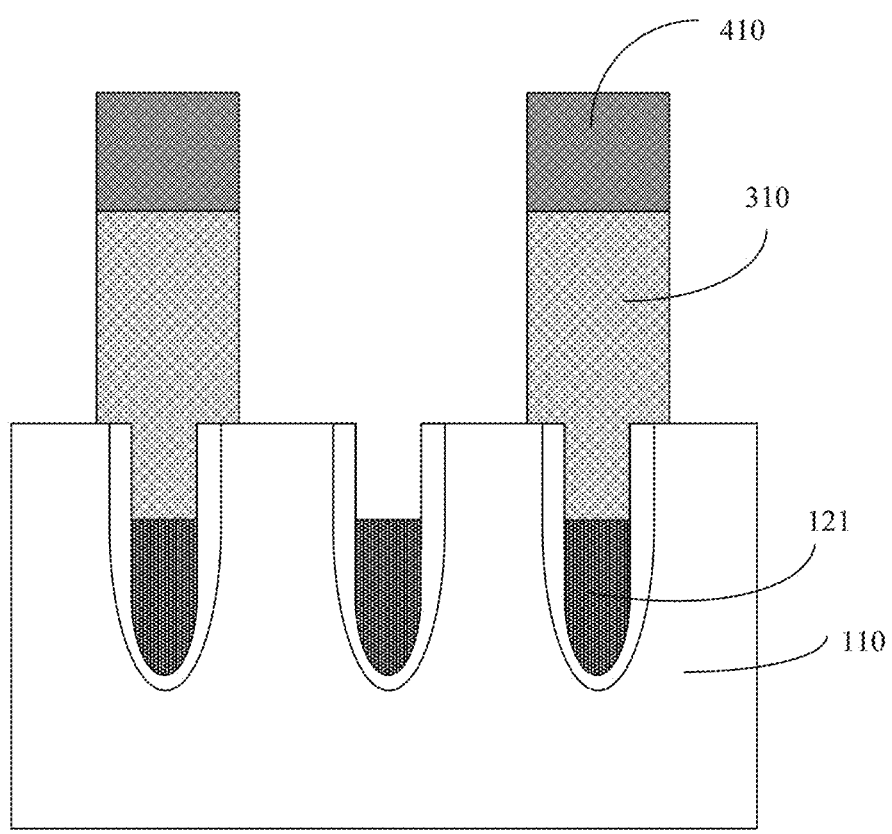
FIG. 10B is a side cross-sectional view of one embodiment corresponding to a section line AA' in FIG. 10A.

As shown in FIG. 10A and FIG. 10B, FIG. 10A is a top view in which the 2*N metal lines 410 are formed, and FIG. 10B corresponds to a side cross-sectional view of a section line AA' in FIG. 10A. The exposed metal layer 400 is etched under the protection of the 2*N masks to form the 2*N independent metal lines 410, and the exposed contact hole layer 300 is continuously etched under the protection of the metal lines 410 to form the 2*N independent contact holes 310. At this time, the 2*N word lines 120, the 2*N contact holes 310 and the 2*N metal lines 410 are in one-to-one correspondence. Each of the word lines 120 is led out through the contact hole 310 and the metal line 410 above the word line 120.

In the embodiment, the contact hole layer 300 extending along the Y-axis direction is formed first, the contact hole layer 300 is integrally formed and electrically connected with multiple word lines 120, then the metal layer 400 is formed on the contact hole layer 300 and on the dielectric layer 200, the mask 500 is formed on the metal layer 400, the mask 500 spans the second groove 201 along the X-axis direction. Next, the exposed metal layer 400 and contact hole layer 300 are sequentially etched under a shielding effect of the mask 500, the contact hole layer 300 extending along the Y-axis direction is cut into multiple independent parts. The metal layer 400 and contact hole layer 300 that are not etched form a lead-out structure of the word line 120. Since the self-aligned etching is used for the contact hole layer 300 as described above, an alignment step of front and back etching in a conventional technology is omitted. In the present application, the boundaries of the reserved metal layer 400 and the reserved contact hole layer 300 after etching are flush, the metal layer 400 and the contact hole layer 300 do not have location offset, thereby greatly improving the electric performance of a semiconductor device.

The above-described word line lead-out structure is formed by the above preparation method of a word line lead-out structure. The contact hole 310 covers the word line 120 along the Y-axis direction, the metal line 410 covers the contact hole 310, and the contact area between the contact hole 310 and the metal line 410 is larger than the contact area between the contact hole 310 and the word line 120. According to the above word line lead-out structure, through adjustment of the contact area between the contact hole 310 and the word line 120, and the contact area between the contact hole 310 and the metal line 410, the contact area between the contact hole 310 and the word line 120 is relatively small, so that the influence of the contact hole 310 on the integration level of the device is reduced. The contact area between the contact hole 310 and the metal line 410 is relatively large, so that the contact resistance of the whole word line lead-out structure is reduced, thereby improving the induction margin of the semiconductor memory and the charging and discharging speed of a storage capacitor.

The above embodiments are merely illustrative of several embodiments of the disclosure, which are described in more detail and are not to be construed as limiting the scope of the patent of the disclosure. It is to be noted that several variations and modifications may be made by those skilled in the art without departing from the spirit of the disclosure, which all fall within the scope of protection of the disclosure. Therefore, the scope of protection of the patent of the disclosure shall be determined by the appended claims.

The invention claimed is:

1. A word line lead-out structure, comprising:
    2*N word lines, each of the word lines extending along an X-axis direction and being distributed in parallel along the X-axis direction;
    2*N contact holes, each of the contact holes covering one of the word lines along a Y-axis direction, the X-axis direction being perpendicular to the Y-axis direction; and
    2*N metal line, each of the metal lines extending along the Y-axis direction and covering one of the contact holes, each of the contact holes being located between a corresponding one of the word lines and a corresponding one of the metal lines and being contacted with the corresponding one of the word lines and the corresponding one of the metal lines,
    wherein a contact area between each of the contact holes and the metal lines is larger than a contact area between each of the contact holes and the word lines,
    wherein N is a positive integer, and
    wherein the 2*N word lines, the 2*N contact holes and the 2*N metal lines are in one-to-one correspondence.

2. The word line lead-out structure of claim 1, wherein a cross-section of each of the contact holes is a T-shaped structure.

3. The word line lead-out structure of claim 1, wherein the word lines are aligned in the Y-axis direction.

4. The word line lead-out structure of claim 1, wherein N metal lines of the 2*N metal lines and N contact holes of the 2*N contact holes are located at one side of each of the word lines along the X-axis direction, another N metal lines of the 2*N metal lines and another N contact holes of the 2*N contact holes are located at another side of each of the word lines along the X-axis direction; wherein the metal lines located at same side are distributed in parallel along the Y-axis direction.

5. The word line lead-out structure of claim 4, wherein the contact holes located at one side of each of the word lines cover odd-numbered word lines, and the contact holes located at the other side of each of the word lines cover even-numbered word lines.

6. The word line lead-out structure of claim 1, wherein a conductivity of each of the word lines is different from a conductivity of each of the metal lines.

7. A method for preparing the word line lead-out structure, comprising:
    providing first grooves in a substrate;

forming the word lines extending along the X-axis direction in the first grooves, a top surface of the word lines being lower than a top surface of the substrate;

forming a contact hole layer on the word lines and the substrate;

forming a metal layer on the contact hole layer; and etching the metal layer and the contact hole layer to form the word line lead-out structure of claim 1.

8. The method of claim 7, wherein;

said forming a contact hole layer on the word lines and the substrate comprises:

forming a dielectric layer on the substrate and the word lines, etching the dielectric layer to form a second groove extending along the Y-axis direction, the second groove penetrating through the dielectric layer and exposing the word lines and the substrate, and forming the contact hole layer in the first grooves and the second groove;

said etching the metal layer and the contact hole layer comprises:

forming 2*N masks on the metal layer, each of the masks spanning the second groove along the X-axis direction and covering one of the word lines along the Y-axis direction, and sequentially etching the metal layer and the contact hole layer, reserving the metal layer below each of the masks to form the 2*N metal lines, and reserving the contact hole layer below each of the metal lines to form the 2*N contact holes.

9. The method of claim 8, wherein each of the word lines comprises a metal structure located at bottom, and a polysilicon structure stacked on the metal structure, before said forming the contact hole layer in the second groove, further comprising: removing the polysilicon structure, and reserving the metal structure.

10. A method for preparing the word line lead-out structure, comprising:

providing a first groove in a substrate;

forming a word line extending along an X-axis direction in the first groove, a top surface of the word line being lower than a top surface of the substrate;

forming a contact hole layer on the word line and the substrate;

forming a metal layer on the contact hole layer; and etching the metal layer and the contact hole layer to form a word line lead-out structure, comprising:

the word line, extending along the X-axis direction;

a contact hole, covering the word line along a Y-axis direction, the X-axis direction being perpendicular to the Y-axis direction; and a metal line, covering the contact hole, the contact hole being located between the word line and the metal line and being contacted with the word line and the metal line, wherein a contact area between the contact hole and the metal line is larger than a contact area between the contact hole and the word line.

* * * * *